(12) United States Patent
Brotsack

(10) Patent No.: US 8,792,082 B2
(45) Date of Patent: *Jul. 29, 2014

(54) ILLUMINATION SYSTEM FOR MICROLITHOGRAPHY

(75) Inventor: Markus Brotsack, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 774 days.

This patent is subject to a terminal disclaimer.

(21) Appl. No.: 12/984,078

(22) Filed: Jan. 4, 2011

(65) Prior Publication Data

US 2011/0096316 A1    Apr. 28, 2011

Related U.S. Application Data

(63) Continuation of application No. 11/860,193, filed on Sep. 24, 2007, now Pat. No. 7,884,922, which is a continuation of application No. 11/175,172, filed on Jul. 7, 2005, now Pat. No. 7,283,209.

(30) Foreign Application Priority Data

Jul. 9, 2004  (DE) .......................... 10-2004-034935

(51) Int. Cl.
G03B 27/54    (2006.01)
G03B 27/72    (2006.01)
G03F 7/20     (2006.01)

(52) U.S. Cl.
CPC ................................ *G03F 7/70191* (2013.01)
USPC ............................................. 355/67; 355/71

(58) Field of Classification Search
CPC .......................... G03F 7/70108; G03F 7/70116
USPC ............ 355/52, 53, 55, 67–71; 356/399–401; 359/679, 890–892; 250/548
See application file for complete search history.

(56) References Cited

U.S. PATENT DOCUMENTS

| 5,638,211 A | 6/1997 | Shiraishi |
| 5,707,501 A | 1/1998 | Inoue et al. |
| 5,850,310 A | 12/1998 | Schweizer |
| 6,051,842 A | 4/2000 | Yamamoto |
| 6,215,547 B1 | 4/2001 | Ramanujan et al. |
| 6,215,578 B1 | 4/2001 | Lin |

(Continued)

FOREIGN PATENT DOCUMENTS

| DE | 19944760 A1 | 3/2001 |
| EP | 0 747 772 A1 | 12/1996 |

(Continued)

*Primary Examiner* — Hung Henry Nguyen
(74) *Attorney, Agent, or Firm* — Edell, Shapiro & Finnan, LLC

(57) ABSTRACT

An illumination system for a microlithography projection exposure apparatus for illuminating an illumination field with the light from an assigned light source includes a pupil shaping unit for receiving light from the assigned light source and for generating a predeterminable basic light distribution in a pupil plane of the illumination system, and a transmission filter assigned to the pupil shaping unit and having at least one array of individually drivable individual elements for the spatially resolving transmission filtering of the light impinging on the transmission filter in or in proximity to a pupil plane of the illumination system. The transmission filter generates a predetermined correction of the basic light distribution. An illumination system of this type can generate a multiplicity of location-dependent intensity distributions in a pupil plane of the illumination system, and ensure a high transmittance.

23 Claims, 4 Drawing Sheets

(56) References Cited

U.S. PATENT DOCUMENTS

| | | |
|---|---|---|
| 6,233,041 B1 | 5/2001 | Shiraishi |
| 6,281,967 B1 | 8/2001 | Kudo |
| 6,563,567 B1 | 5/2003 | Komatsuda et al. |
| 6,611,574 B2 | 8/2003 | Singer et al. |
| 6,658,084 B2 | 12/2003 | Singer |
| 6,665,052 B2 | 12/2003 | Sato |
| 6,704,092 B2 | 3/2004 | Shiraishi |
| 6,707,595 B2 | 3/2004 | Kutz et al. |
| 6,864,960 B2 * | 3/2005 | Koehler et al. ............ 355/67 |
| 6,900,946 B2 | 5/2005 | Koehler |
| 6,965,119 B2 | 11/2005 | Sandstrom et al. |
| 6,965,364 B1 | 11/2005 | Eggers et al. |
| 7,006,595 B2 | 2/2006 | Singer et al. |
| 7,016,017 B2 | 3/2006 | Hansen |
| 7,061,582 B2 | 6/2006 | Zinn et al. |
| 7,095,560 B2 * | 8/2006 | Toyoda et al. ............ 359/558 |
| 7,884,922 B2 * | 2/2011 | Brotsack .................. 355/71 |
| 2002/0136351 A1 | 9/2002 | Singer |
| 2003/0227606 A1 | 12/2003 | Sweatt |
| 2005/0002002 A1 | 1/2005 | Shirota et al. |
| 2005/0168790 A1 | 8/2005 | Latypov et al. |
| 2005/0226000 A1 | 10/2005 | Bader et al. |
| 2008/0225259 A1 | 9/2008 | Singer et al. |

FOREIGN PATENT DOCUMENTS

| | | |
|---|---|---|
| EP | 1 262 836 A1 | 12/2002 |
| JP | 06216007 A | 8/1994 |
| JP | 10022209 A | 1/1998 |
| JP | 11054417 A | 2/1999 |
| JP | 11312639 A | 11/1999 |
| JP | 12150375 A | 5/2000 |
| WO | 00/36470 A1 | 6/2000 |
| WO | 2004/006021 A2 | 1/2004 |
| WO | 2005/026843 A2 | 3/2005 |
| WO | 2005/096098 A2 | 10/2005 |

* cited by examiner ents and other finely patterned devices is substantially deter-
ILLUMINATION SYSTEM FOR MICROLITHOGRAPHY This is a continuation of application Ser. No. 11/860,193, filed on Sep. 24, 2007, now U.S. Pat. No. 7,884,922, which is a continuation of application Ser. No. 11/175,172, filed on Jul. 7, 2005, now U.S. Pat. No. 7,283,209. The entire disclosures of the prior applications, application Ser. Nos. 11/860, 193 and 11/175,172, are hereby incorporated by reference. The present application also claims priority from German Patent Application DE 10 2004 034935.5, filed on Jul. 9, 2004, the disclosure of which is also hereby incorporated into the present application by reference.

BACKGROUND OF THE INVENTION

1. Field of the Invention

The invention relates to an illumination system for a microlithography projection exposure apparatus for illuminating an illumination field with the light from an assigned light source, and to a method for illuminating an illumination field, in particular with such an illumination system.

2. Description of the Related Art

The performance of projection exposure apparatuses for the microlithographic fabrication of semiconductor components and other finely patterned devices is substantially determined by the imaging properties of the projection objectives. Furthermore, the image quality and the wafer throughput that can be achieved with the apparatus are substantially co-determined by properties of the illumination system arranged upstream of the projection objective. Said illumination system must be able to prepare the light from a primary light source, for example a laser, with the highest possible efficiency and in the process to generate an intensity distribution that is as uniform as possible in an illumination field of the illumination system.

A high degree of uniformity or homogeneity can be achieved by mixing the light coming from the light source with the aid of a light mixing device. In the case of light mixing devices, a distinction is made essentially between light mixing devices with fly's eye condensers and light mixing devices with integrator rods or light mixing rods.

Moreover, it is intended to be possible to set different illumination modes at the illumination system in order, for example, to optimize the illumination in accordance with the structures of the individual originals to be imaged (masks, reticles). Pupil shaping units are provided for setting the illumination modes or illumination settings, which pupil shaping units can generate a predeterminable light distribution in a pupil plane.

In the case of illumination systems which, for setting different illumination modes, operate with exchangeable optical elements (e.g. diffractive optical elements or spatial filters), the number of different illumination settings is limited by the number of different elements that can be exchanged. If the intention is that a large number of illumination settings can be set at such systems, a multiplicity of exchangeable optical elements must be made available, the production of which is complicated and may be associated with considerable costs.

The use of digital filters in illumination systems is known for various purposes. The filters may be positioned e.g. as variable aperture diaphragms or as pupil shaping elements for setting a predeterminable light distribution in a pupil plane. A pupil shaping exclusively by means of filters is always associated with loss of light, however, particularly if relatively large regions of the light distribution incident on the filter have to be masked out for producing off-axis settings.

U.S. Pat. No. 6,215,578 describes a wafer stepper comprising an illumination system for generating abaxial illumination settings. The illumination system has an electronically drivable, first digital filter for setting illumination settings. Arranged downstream of said first digital filter is a second digital filter, which is positioned on the illumination field of the illumination system and generates there a predeterminable mask pattern that is imaged onto a wafer through a projection objective arranged downstream. Both digital filters can be driven jointly by means of a computer, thereby enabling the light distribution generated by the pupil shaping element to be adapted to the mask structure.

U.S. Pat. No. 5,707,501 shows a projection exposure apparatus which, in one embodiment, comprises a transmission filter designed as a liquid crystal array. Said transmission filter is arranged before a fly's eye condenser in the illumination system of the projection exposure apparatus and serves as a pupil shaping element in order to set e.g. annular illumination.

JP 06216007 describes a projection exposure apparatus having an illumination system in which a liquid crystal digital filter is arranged in the region of a pupil plane in the light path behind a fly's eye condenser. The digital filter is electrically drivable and serves as an adjustable diaphragm for limiting the beam bundle diameter.

JP 10022209 describes a filter which comprises an array of liquid crystals and is designed for use in an illumination system of a projection exposure apparatus. The filter serves as a transmission filter with location-dependent transmission that can be set variably and permits the setting of desired two-dimensional intensity distributions. The resolution and the depth of focus of the projection are thus intended to be able to be influenced.

U.S. Pat. No. 6,281,967 shows an illumination system for a microlithographic projection exposure apparatus having a rod integrator. In the light path before the rod integrator there is provided a transmission filter element for setting the intensity distribution of the light falling into the rod integrator. The filter element can be exchanged as required for filter elements having a different transmission distribution. A turret plate is arranged in a pupil plane behind the rod integrator, there being fitted in said turret plate a plurality of aperture arrangements which in each case have openings of different size or form and serve for pupil shaping.

U.S. Pat. No. 6,051,842 describes an illumination system having a fly's eye condenser, upstream of which a variable optical filter is arranged. The filter serves as a variable attenuator for homogenizing the light distribution in a field plane upstream of the fly's eye condenser.

The documents JP 12150375, JP 11312639 and JP 11054417 show embodiments of filters which all serve for homogenizing the light distribution in a field plane. In this case, the location-dependent filter effect is fixedly predetermined and can only be altered by a filter change.

SUMMARY OF THE INVENTION

It is one object of the invention to provide an illumination system for a microlithography projection exposure apparatus which, with a simple construction, permits a high degree of variability in the setting of illumination modes, a high transmission efficiency of the illumination system remaining ensured. It is another object to provide a corresponding method for illuminating an illumination field, in particular with such an illumination system.

To address these and other objects the invention, according to one formulation, provides an illumination system for a microlithography projection exposure apparatus for illuminating an illumination field with the light from an assigned light source comprising a pupil shaping unit for receiving light from the assigned light source and for generating a predetermined basic light distribution in a pupil plane of the illumination system; and a transmission filter assigned to the pupil shaping unit and having at least one array of individually drivable individual elements for the spatially resolving transmission filtering of the light impinging on the transmission filter, the transmission filter being arranged in or in proximity to a pupil plane of the illumination system; the transmission filter being designed for generating a predetermined correction of the basic light distribution.

An illumination system according to the invention comprises a pupil shaping unit for receiving light from the assigned light source and for generating a predeterminable basic light distribution in a pupil plane of the illumination system, and a transmission filter assigned to the pupil shaping unit and having at least one array of individually drivable individual elements for the spatially resolving transmission filtering of the light impinging on the transmission filter in or in proximity to a pupil plane of the illumination system. The transmission filter is designed for generating a predeterminable correction of the basic light distribution.

The pupil shaping unit may be designed e.g. for generating conventional illumination with a different degree of coherence, annular field illumination and also dipole or quadrupole illumination in a pupil plane of the illumination system. Such a pupil shaping unit may be designed in such a way that even in the case of off-axis illumination, only a small loss of light occurs during the pupil shaping. The basic light distribution generated by the pupil shaping unit can be optimized further for a predetermined structure to be imaged on the illumination field by the basic light distribution being slightly corrected locally with the aid of the transmission filter. For this purpose, the transmission filter can mask out parts of the basic light distribution which are not required for the imaging of the predetermined structure, or it can locally introduce a small attenuation in order to exactly set a desired distribution proceeding from the basic light distribution with minimal loss of light.

In one development of the illumination system, the transmission filter is arranged downstream of the pupil shaping unit. The transmission filter may be fitted for example in or in proximity to the pupil plane of the illumination system in which the pupil shaping unit generates the basic light distribution. An arrangement in the region of an optically conjugate plane with respect to the pupil plane is also possible.

In one embodiment, the transmission filter is designed or driven in such a way that it transmits more than 90% and less than 100% of the light impinging on it in at least one operating mode, preferably in most or in all of the illumination settings. The transmission filter thus corrects only a small part of the basic light distribution, so that a large part of the intensity of the illumination radiation is preserved.

In one development of the illumination system, the transmission filter is designed as a digital filter. The individual elements of the digital filter can be changed over between two states: approximately complete transmission (approximately 100%) or complete obscuration (0%). A particularly simple construction is possible as a result of this. The individual elements may also be tunable in order to enable partial transmission.

In one embodiment of the illumination system, the cross section of the individual elements is rectangular and the latter are arranged essentially without an interspace in a manner filling the area in a rectangular raster arrangement. The transmission filter can easily be driven given a regular arrangement of the individual elements. The rectangular raster elements may be square, in particular. The larger the number of raster elements, the better the spatial resolution of the transmission filter effect. However, a large number of raster elements cannot be driven as easily as a small number, so that a compromise should be found for the choice of a suitable number of raster elements. Depending on the desired spatial resolution and total area of the transmission filter, there may be present e.g. between approximately 100 and approximately 1,000 raster elements, if appropriate also several thousand, e.g. between 2,000 and 8,000 or more.

Various principles of action may be utilized for the construction of a transmission filter. The individually drivable individual elements may be liquid crystal elements, for example, which may be light-nontransmissive (opaque) or light-transmissive (transparent) depending on the electrical driving. It is also possible to set the transmittance of the individual elements between complete blocking and complete transparency in steps or in continuously variable fashion in order to obtain intermediate values of the transmission (partial transparency).

A transmission filter may also operate with an array of mechanical shutter elements that may be configured for example as foldable small doors or slides. With mechanical diaphragm elements of this type arranged in rasterlike fashion, a digital filtering is possible in an expedient manner. For setting intermediate values of the transmission, the beam cross section of the individual part bundles can be individually reduced to a desired value in order to obtain a desired target value for the transmission desired at the location of the diaphragm element.

Polarization effects may likewise be utilized for the construction of a transmission filter that can be used in the case of the invention. The applicant's German patent application 10 2004 011733.0 filed on Mar. 4, 2004 shows a transmission filter device having a cell arrangement that can be operated in transmission for the purpose of generating a location-dependent retardation effect on the light of an entrance light distribution, which can be driven for the purpose of generating a temporally variable retardation effect, and also at least one polarization filter arrangement arranged behind the cell arrangement in the light path. The cell arrangement generates from the entrance light distribution a light distribution polarized in location-dependent fashion, on which a polarization-selective, location-dependent intensity filtering is performed by means of the polarization filter arrangement. If the cell arrangement is designed for setting a temporally variable retardation effect, a time- and location-dependent intensity filtering on the light of the entrance light distribution is possible. One embodiment utilizes the electro-optical effect (Pockels effect). For this purpose, the individual elements of the transmission filter comprise suitable electrically drivable nonlinear optical crystals whose retardation effect on the light passing through can be set in continuously variable fashion by application of a suitable voltage. The disclosure content of this patent application is incorporated in the content of the present application by reference.

The examples mentioned above can be operated in transmission, so that those components of the impinging light on which no intensity reduction takes place can pass through the transmission filter essentially unimpeded. Reflective variants of transmission filters are also possible. By way of example, a transmission filter may comprise an array of individually drivable individual mirrors (micromirror array, digital mirror device, DMD). Such a micromirror arrangement may be incorporated obliquely into the beam path, so that the impinging light bundle as a whole is deflected by the micromirror arrangement. For spatially resolving transmission filtering, individual mirror elements can be adjusted such that the impinging light is deflected into a spatial region that is no longer registered by the downstream optical subsystem and, consequently, is no longer available in the light path behind the transmission filter. Such reflective filters are also referred to as "transmission filters" here since they can influence the overall transmission of the optical system at their incorporation location in spacially resolving fashion.

A spatially resolving transmission filter may also contain a two-dimensional array arrangement (raster arrangement) of individually drivable diffractive optical elements or individually drivable acousto-optical elements which mask out a part of the impinging radiation from the beam path in spacially resolving fashion and can thus act as transmission filters. These transmission filters may be of reflective or transmissive design.

In one development of the illumination system, the pupil shaping unit comprises at least one diffractive optical element. The diffractive optical element is usually positioned in a field plane of the illumination system, where it generates an angular distribution of the illumination light which generates a spatial distribution of the intensity upon transfer to a downstream pupil plane.

In one development of the illumination system, the pupil shaping unit comprises a changing device for exchanging the diffractive optical element for at least one further diffractive optical element. Various basic light distributions can be selected by means of exchanging diffractive elements. Since the number of basic light distributions that can be set in this case is limited by the number of exchangeable diffractive elements and the production thereof is complicated, the transmission filter is used for fine tuning of the illumination radiation to the mask structures to be illuminated.

In one embodiment of the illumination system, the pupil shaping unit comprises an axicon system. Adjustable axicons can be used to realize off-axis illumination settings (e.g. annular illumination) without any loss of light.

In one development of the illumination system, the pupil shaping unit comprises a zoom unit. The zoom unit serves for scale magnifying/demagnifying of the light distribution generated. In combination with the axicon and the diffractive optical element, the pupil shaping unit can generate a plurality of basic light distributions practically without any loss of light. The pupil shaping unit may be constructed e.g. in the manner as described in the applicant's EP 0 747 772. The content thereof is incorporated in the content of the description by reference.

In one embodiment, an integrator rod arrangement having at least one integrator rod is provided behind the pupil shaping unit and the transmission filter. The integrator rod serves for homogenizing a light distribution that enters it. The pupil shaping unit generates a basic light distribution which is corrected by the transmission filter before a homogenization of the illumination light takes place.

In one development of the illumination system, an integrator rod arrangement having at least one integrator rod is provided between the pupil shaping unit and the transmission filter. The pupil shaping unit generates a basic light distribution which is subsequently homogenized by the rod. This homogenized light distribution is corrected by means of the transmission filter.

In one embodiment of the illumination system, the cross-sectional area of the filter elements is small relative to a parcel area produced by the integrator rod in a pupil plane of the illumination system. This proves to be advantageous if the light distribution homogenized by the integrator rod is intended to be corrected by means of the transmission filter, since a spatially resolved filtering effect is possible in this case, too within individual parcels.

In one development of the illumination system, a refractive optical element for generating a light distribution adapted to the form of the illumination field is provided in or in proximity to a pupil plane. In the case of systems with an integrator rod, the usually rectangular form of the illumination field corresponds to the form of the cross-sectional area of the rod, i.e. the aspect ratio matches. Through an imaging objective arranged downstream of the integrator rod, the rod exit surface can be imaged onto the illumination field in a size altered by the imaging scale of the imaging objective.

In one embodiment of the illumination system, a fly's eye condenser with at least one raster arrangement of raster elements is arranged behind the pupil shaping unit. Fly's eye condensers of customary design comprise a raster arrangement positioned in a first plane and a raster arrangement positioned in a downstream second plane, which is conjugate with respect to the first plane. The transmission filter may be positioned e.g. in proximity to the first raster arrangement before the latter.

In one embodiment of the illumination system, neither a fly's eye condenser nor an integrator rod arrangement is fitted behind the pupil shaping unit. Such illumination systems, which are typically used in wafer scanners, often operate with diaphragms or filters as homogenizing units. This is possible since homogenizing the intensity integrated over the illumination field may suffice in the scanning process.

In one development of the illumination system, a control unit is provided for adapting the basic light distribution generated by the pupil shaping unit and the transmission function of the transmission filter to a mask structure to be illuminated. An optimum adaptation of the illumination radiation to the mask structure to be illuminated may have an advantageous effect on the exposure quality of the microlithography projection exposure apparatus.

In a method according to the invention for illuminating an illumination field, which may be carried out in particular with an illumination system described above, the light distribution in a pupil plane of the illumination system is adapted to a mask structure to be illuminated by a procedure in which, by means of a pupil shaping unit, a basic light distribution is set in or in proximity to a pupil plane and a transmission filter positioned in or in proximity to a pupil plane or in a plane that is conjugate with respect thereto is driven for the purpose of filtering a part of the light distribution that is not required for the illumination of the mask structure. The driving is preferably effected in such a way that the filter transmits more than 90% of the intensity of the basic light distribution. The method makes it possible to precisely adapt a light distribution in a pupil plane to a mask structure to be imaged without significant reduction in the illumination intensity occurring. In individual cases, lower overall transmissions may also be useful, e.g. 75%, 80% or 85%.

In one development of the method, one from a plurality of diffractive optical elements is selected for the purpose of generating the basic light distribution. Various basic light distributions can be set by exchanging diffractive optical elements.

In one refinement of the method, a change is carried out between a first and a second mask structure, a light distribution adapted to the first mask structure being converted into a light distribution adapted to the second mask structure by changing the transmission function of the transmission filter, in particular without a change of the diffractive optical element being carried out. In the case of two mask structures that are illuminated with similar light distributions, it may be expedient for an adaption of the light distribution to be carried out exclusively by means of the transmission filter.

The above and further features emerge not only from the claims but also from the description and from the drawings, in which case the individual features may be realized, and may represent advantageous embodiments protectable per se, in each case on their own or as a plurality in the form of sub-combinations in embodiments of the invention and in other fields.

DETAILED DESCRIPTION OF THE PREFERRED EMBODIMENTS

Figure 1:
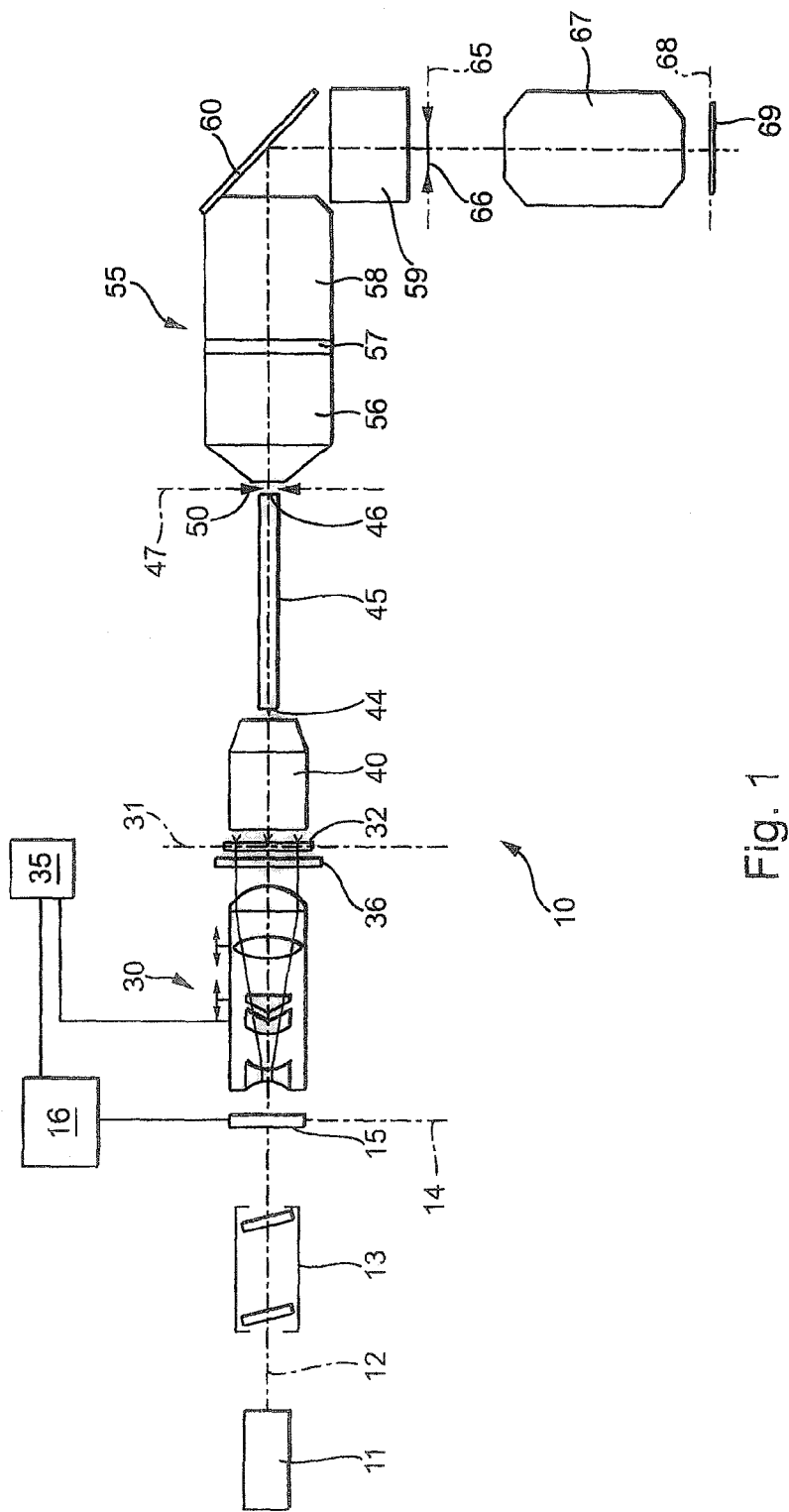
FIG. 1 shows a schematic side view of an embodiment of an illumination system for a microlitho-graphy projection exposure apparatus with a pupil shaping unit and a transmission filter.

FIG. 1 shows an example of an illumination system 10 of a projection exposure apparatus for microlithography which can be used in the fabrication of semiconductor components and other finely patterned devices and operates with light from the deep ultraviolet range in order to obtain resolutions down to fractions of micrometers. The light source 11 used is an $F_2$ excimer laser having an operating wavelength of approximately 157 nm, the light beam of which is oriented coaxially with respect to the optical axis 12 of the illumination system. Other UV light sources, for example ArF excimer lasers having an operating wavelength of 193 nm, KrF excimer lasers having an operating wavelength of 248 nm or mercury vapor lamps having an operating wavelength of 365 nm or 436 nm or light sources having wavelengths of less than 157 nm are likewise possible.

The light from the light source 11 firstly enters a beam expander 13, which expands the laser beam and forms an expanded profile with parallel light from the original beam profile. In the light path behind the beam expander 13, a diffractive optical element 15 is arranged in a field plane 14 of the illumination system. This forms, together with a zoom axicon objective 30 positioned behind it in the beam path, a pupil shaping unit serving for generating a predeterminable basic light distribution in an exit pupil plane 31 of the objective 30. A refractive optical raster element 32 is arranged in the exit pupil plane 31. The exit pupil plane 31 is also referred to hereinafter as pupil shaping surface 31 of the illumination system. The basic light distribution in the pupil shaping surface 31 can be set by adjusting the zoom axicon objective 30 and also by exchanging the diffractive optical element 15 by means of a changing device 16 (cf. e.g. EP 0 747 772).

By way of example, conventional illumination with a different degree of coherence, or an approximate annular field, dipole or quadrupole illumination can be set as basic light distributions by means of the pupil shaping unit. Particularly in the case of off-axis illumination, the basic light distribution may be distributed nonuniformly over illuminated and unilluminated partial regions of the pupil shaping surface, which may result in greater intensity variations.

A transmission filter 36 is provided in the beam path directly before the refractive optical raster element 32. Said filter serves for correcting the basic light distribution generated by the pupil shaping unit 15, 30. The transmission filter 36 has a multiplicity of individual drivable optical channels arranged in a raster arrangement, so that the two-dimensional transmission function of the transmission filter can be set variably in location-dependent fashion.

A coupling-in optic 40 arranged behind the pupil shaping surface 31 transmits the light from the pupil shaping surface 31 onto the rectangular entrance surface 44 of a rod-type light integrator 45 produced from synthetic quartz glass (or calcium fluoride), which light integrator mixes and homogenizes the light passing through by means of multiple internal reflection. The pupil shaping surface 31 is a Fourier-transformed plane with respect to the entrance surface 44, so that a spatial intensity distribution in the pupil shaping surface 31 is transformed into an angular distribution at the rod entrance 44. An intermediate field plane 47 lies directly at the exit surface 46 of the rod 45, in which plane is arranged a reticle masking system (REMA) 50, which serves as an adjustable field diaphragm. The downstream objective 55 images the intermediate field plane 47 with the masking system 50 onto a plane 65, which is also referred to here as reticle plane. A reticle 66 is arranged in the reticle plane 65. The plane 47 of the reticle masking system and the reticle plane 65 are planes in which an illumination field of the illumination system is situated. The reticle plane 65 coincides with the object plane of a projection objective 67, which images the reticle pattern into its image plane 68, in which a wafer 69 coated with a photoresist layer is arranged. The objective 55 contains a first lens group 56, a pupil intermediate plane 57, into which filters or diaphragms can be introduced, a second and a third lens group 58, 59 and a deflection mirror 60 situated in between, which mirror makes it possible to incorporate the large illumination device horizontally and to mount the reticle horizontally. The integrator rod 45 generates a plurality of parcels in the pupil surface 57 of the objective 55 by means of the multiple reflections of the light in its interior.

The illumination system 10 forms together with the projection objective 67, an adjustable reticle holder, which holds the reticle 66 in the object plane 65 of the projection objective, and an adjustable wafer holder, a projection exposure apparatus for the microlithographic fabrication of electronic devices but also of diffractive optical elements and other micropatterned parts. The illumination system can be used both in a wafer stepper and in a wafer scanner.

The angular distribution which the illumination system 10 generates in the illumination field 65 is determined by prescribing the location-dependent intensity distribution on the pupil shaping surface 31. If said angular distribution is to be adapted to a predetermined reticle 66, the basic light distribution can be set by exchanging the diffractive optical element 15 and/or setting the zoom axicon objective 30 essentially without any loss of light. If the basic light distribution is already set optimally, the transmission filter can also be switched "to passage" (full transmission). A slight modification of the basic light distribution for precise adaptation to the reticle 66 is often desired, however, which can be carried out by setting the transmission filter 36. The loss of light occurring during the filtering can be kept within small limits since the pupil shaping unit 15, 30 sets the intensity distribution in the pupil shaping surface 31 essentially correctly. The combination of exchangeable diffractive optical elements 15, zoom axicon objective 30 and transmission filter 36 therefore permits the generation of a multiplicity of different light distributions in the pupil shaping surface 31 with only little loss of light and a very precise optimization of the two-dimensional intensity distribution in the pupil shaping surface 31.

In order to optimally adapt the radiation supplied by the illumination system to the reticle 66, a control unit 35 is provided, which is connected to the changing unit 16, the zoom axicon objective 30 and also the transmission filter 36.

The transmission filter 36 is designed as a digital filter. It has individual elements (pixels) with a rectangular cross section which are arranged in a manner filling the area in a rectangular raster arrangement (LCD display). The individual elements of the digital filter can be in two states, corresponding to virtually complete transmission of the illumination light or complete obscuration thereof. The cross section of the individual elements is designed such that it is less than the parcel cross section of the parcels generated by the integrator rod 45 in the pupil plane 57. The cross section of the individual elements may be e.g. $1/n_E$ of the parcel cross section in a specific direction, where $n_E=2, 3, 4, 5 \ldots$. The parcel cross section $\Delta x$ in the x direction is a function of the length L, the refractive index n and also the rod extent x of the rod integrator in the x direction considered and also the focal length $f_E$ of the coupling-in optic and can be calculated by $\Delta x = 2 \cdot f_E \cdot n \cdot \sin(\arctan(x/(2 \cdot L)))$. The same applies correspondingly to the y direction.

In the example shown, the integrator rod 45 has a rectangular cross section of 35 mm by 11 mm and a length of approximately 570 mm. The cross-sectional area required on the pupil shaping surface 31 in order to cover a parcel is 2.148 mm by 0.614 mm. If nine pixels of the transmission filter 36 are to cover a parcel area in order to achieve a good spatial resolution, each pixel should have a cross section of 0.716 mm by 0.205 mm. If the illuminated part of the pupil shaping surface 31 has a diameter of 100 mm, then a number of approximately 6000 pixels are required for the transmission filter 36.

Figure 2:
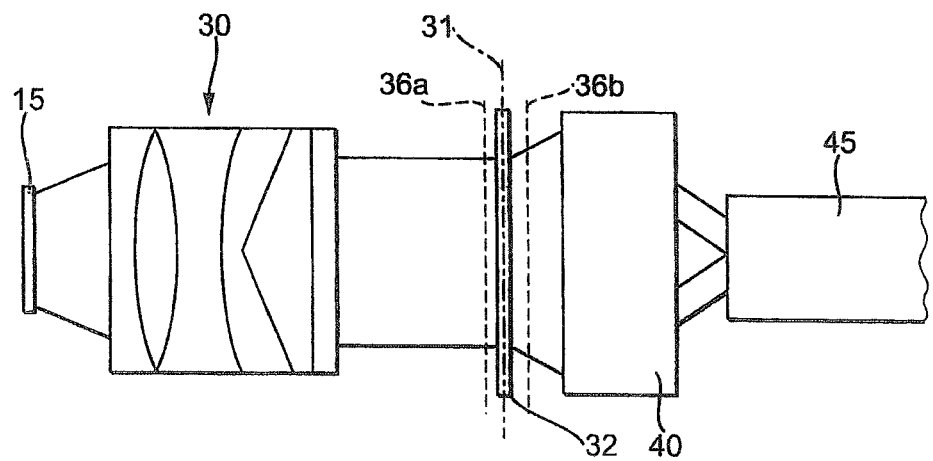
FIG. 2 shows a schematic detail view of the illumination system from FIG. 1.

The transmission filter 36 may, as shown in FIG. 2, be positioned directly upstream of the refractive optical element 32 in a plane 36a or directly downstream of said optical element in a plane 36b. It must be taken into consideration that the beam divergence downstream of the refractive optical element 32 is greater than the beam divergence upstream thereof. Therefore, a positioning upstream of the refractive optical element is generally more favorable. As an alternative, the transmission filter may also be arranged in a pupil plane downstream of the integrator rod 45, e.g. in the pupil plane of the REMA objective 57. It is also possible for more than one transmission filter to be arranged in the illumination system 10; however, it must be taken into consideration that the pixels of digital transmission filters, even if they are switched to transmission, absorb a small part of the light. Therefore, it is preferred to use only a single transmission filter.

Figure 5:
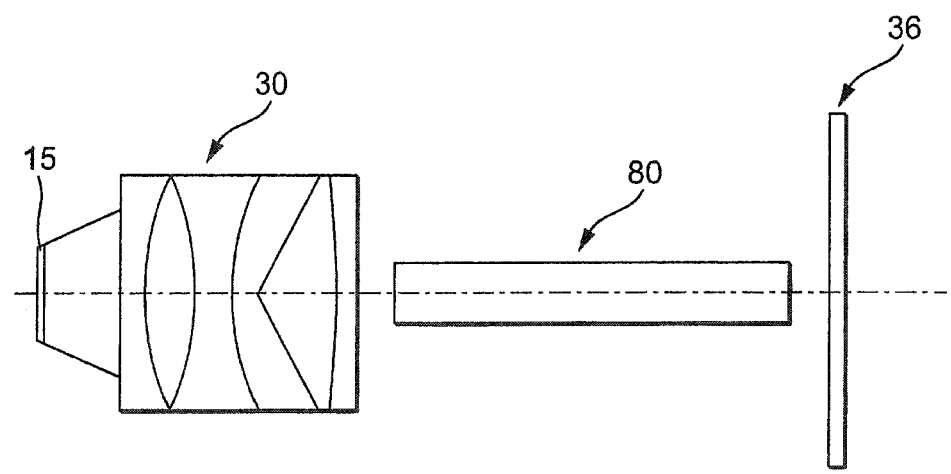
FIG. 5 shows a schematic detail view of an illumination system in which an integrator rod is provided between a pupil shaping unit and a transmission filter.

An illumination system according to the invention may also have a rod integrator 80 positioned between the pupil shaping unit and the transmission filter 36, as shown in FIG. 5.

Figure 3:
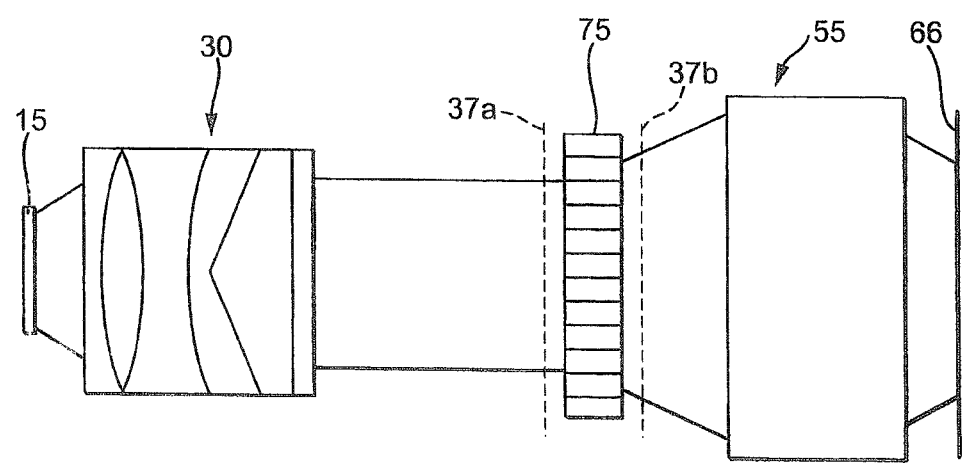
FIG. 3 shows a schematic detail view of an illumination system in which the integrator rod is exchanged for a fly's eye condenser.

An illumination system according to the invention may also be equipped with a fly's eye condenser 75 as a homogenizing unit, as shown in FIG. 3. In this case, the transmission filter may be arranged in a plane 37a directly before the fly's eye condenser 75 or in a plane 37b directly behind the fly's eye condenser. These planes lie in proximity to pupil planes of the illumination system, so that it is possible to influence the spatial distribution of the intensity in a pupil plane.

An illumination system according to the invention may also have neither a rod integrator nor a fly's eye condenser. In this case, it is possible to use e.g. diaphragms or filters for homogenization.

In FIG. 4, two examples are shown schematically to elucidate how a basic light distribution can be optimized or corrected with the aid of an embodiment of a digital filter as the transmission filter 36. For this purpose, subfigures (a) to (d) in each case schematically show, by means of grey-hatched areas, a basic light distribution in the manner of a quadrupole distribution in which four trapezoidal illumination regions with high intensity are present which are arranged outside the optical axis 12 and lie opposite one another in pairs and the remaining region of the pupil plane and thus, in particular, also the region of the optical axis is unilluminated. The transmission filter 36 is represented by a rectangular raster with a multiplicity of squares lying one beside the other, bright squares representing a raster element switched to transmission and black squares representing a raster element switched to blocking. In FIG. 4(a), the entire transmission filter is switched to transmission. In FIG. 4(b), the basic light distribution set by the pupil shaping unit remains unchanged, but the individual cells lying at the lateral edges of the trapezoidal illumination regions are switched on, so that the oblique edges of the trapezoids are masked out. This results in illumination regions which are in each case narrower in the transverse direction than without this optimization by the transmission filter. Less than 10% of the area of the transmission filter is masked out for this correction.

Figure 4A:
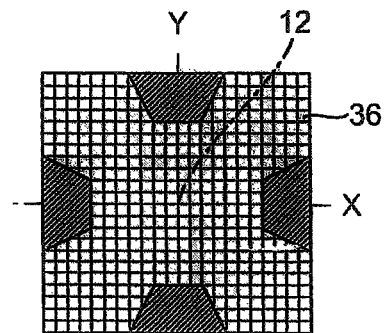
FIG. 4 shows examples of the optimization and correction of basic light distributions with the aid of transmission filters.
Figure 4C:
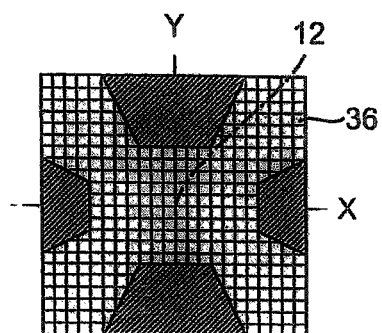
Figure 4B:
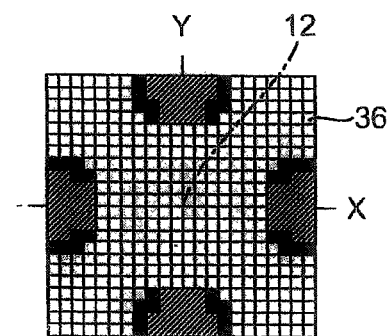
Figure 4D:
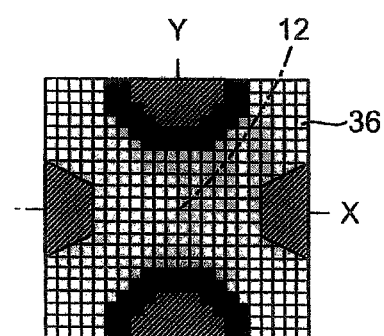

In the case of the basic light distribution shown in FIG. 4(c), the trapezoidal poles of the quadrupole distribution in the pupil shaping surface that lie in the y direction have a larger area than the poles lying in the x direction. This may be favorable in the case of specific reticle structures which have different line widths and/or spacings for different structure directions. However, if a largely matching illumination in the x and y directions is desired, then this can be achieved, proceeding from the basic light distribution shown in FIG. 4(c), with the aid of the transmission filter by virtue of the fact that, in the case of the larger illumination regions lying in the y direction, the edge regions thereof are masked out to such an extent that the size and form of the poles then remaining essentially match the size and form of the illumination poles in the x direction (see FIG. 4(d)). In this way, the transmission filter can be utilized for the correction of asymmetrical distributions.

The invention has been explained by way of example on the basis of illumination systems in which the pupil shaping unit comprises, inter alia, a zoom axicon objective in conjunction with a diffractive optical element. The invention can also be realized with pupil shaping units of different design. Such illumination systems are shown for example in the patent applications with publication number WO 2005/026843 A2, WO 2004/006021 A2, US 2004/0119961 A1 or US 2003/0086524 A1 or patents U.S. Pat. No. 6,658,084 B2, U.S. Pat. No. 6,611,574 B2 from the applicant.

The invention is not restricted to the field of microlithography. By way of example, illumination systems in microscopy may also be configured in accordance with the invention.

The above description of the preferred embodiments has been given by way of example. From the disclosure given, those skilled in the art will not only understand the present invention ant its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. An illumination system for a microlithography projection exposure apparatus configured to illuminate an illumination field with light from an assigned light source, comprising:
   a variable pupil shaping unit comprising a plurality of optical elements configured to receive light from the assigned light source and to generate a light bundle with a basic light distribution in a pupil plane of the illumination system;
   an array of individual adjustable optical elements, wherein the individual adjustable optical elements are arranged in a two-dimensional raster arrangement and configured to be adjusted to provide a location-dependent two-dimensional transmission function; and
   a control unit configured to adapt the basic light distribution generated by the pupil shaping unit and the transmission function of the array of individual adjustable optical elements to a mask structure to be illuminated,
   wherein the array of individual adjustable optical elements is arranged in or in proximity to the pupil plane of the illumination system, or in or in proximity to a plane of the illumination system that is optically conjugate to the pupil plane of the illumination system.

2. The illumination system according to claim 1, further comprising an optical element in a field plane positioned between the assigned light source and the pupil plane,
   wherein the field plane is a Fourier transformed plane with respect to the pupil plane, and
   wherein the optical element is configured to generate an angular distribution of light which generates the basic light distribution upon transfer to the pupil plane.

3. The illumination system according to claim 2, wherein the optical element is a diffractive optical element and wherein the pupil shaping unit comprises a changing device arranged to exchange the diffractive optical element for a second diffractive optical element.

4. The illumination system according to claim 1, further comprising a homogenizing unit configured to mix and homogenize light passing through the homogenizing unit.

5. The illumination system according to claim 4, wherein the homogenizing unit comprises at least one of:
   (i) an integrator rod arrangement comprising at least one integrator rod;
   (ii) a fly's eye condenser comprising a raster arrangement of raster elements;
   (iii) diaphragms; and
   (iv) filters.

6. The illumination system according to claim 4, wherein the homogenizing unit is arranged downstream of the pupil shaping unit and downstream of the array of individual adjustable optical elements.

7. The illumination system according to 4, wherein the homogenizing unit is arranged between the pupil shaping unit and the array of individual adjustable optical elements.

8. The illumination system according to claim 4, wherein the homogenizing unit comprises a fly's eye condenser arranged downstream from the pupil shaping unit,
   wherein the fly's eye condenser comprises an arrangement of raster elements.

9. The illumination system according to claim 1, further comprising a refractive optical raster element configured to generate a light distribution adapted to a form of the illumination field,
   wherein the refractive optical raster element is arranged in or in proximity to a pupil plane of the illumination system.

10. The illumination system according to claim 8, wherein the illumination field is substantially rectangular in shape.

11. The illumination system according to claim 1, wherein the individual adjustable optical elements are selected from the group consisting of:
    (i) mirrors,
    (ii) reflective diffractive optical elements,
    (iii) transmissive diffractive optical elements,
    (iv) reflective acousto-optical elements, and
    (v) transmissive acousto-optical elements.

12. The illumination system according to claim 1, wherein the array of individual adjustable optical elements is a reflective array,
    wherein the reflective array comprises at least one of:
    (i) mirrors,
    (ii) reflective diffractive optical elements, and
    (iii) reflective acousto-optical elements,
    wherein the reflective array is obliquely arranged with respect to the light bundle, and the reflective array is configured to deflect the light bundle as a whole.

13. The illumination system according to claim 12, wherein at least one of the individual adjustable optical elements of the reflective array is configured to deflect a part of an incident light bundle towards a spatial region outside of the illumination field.

14. The illumination system according to claim 1, wherein the basic light distribution is a predetermined distribution selected from the group consisting of:
    (i) conventional illumination with a predetermined degree of coherence, and
    (ii) off-axis illumination.

15. The illumination system according to claim 14, wherein the off-axis illumination is selected from the group consisting of:
    (i) annular field illumination, and
    (ii) multi-polar illumination.

16. The illumination system according to claim 1, wherein the array of individual adjustable optical elements is configured to generate a predetermined correction of the basic light distribution.

17. The illumination system according to claim 12, wherein the reflective array of individual adjustable reflective optical elements is configured to generate a predetermined correction of the basic light distribution.

18. The illumination system according to claim 1, wherein, in at least one operating mode, the array of individual adjustable optical elements is configured to transmit more than 90% and less than 100% of the light impinging on the array of individual adjustable optical elements.

19. The illumination system according to claim 1, wherein the individual adjustable optical elements are arranged at least substantially without interspaces and filling an area in the two-dimensional raster arrangement.

20. A microlithography projection exposure apparatus comprising the illumination system according to claim 1.

21. A method for illuminating an illumination field, comprising:
    receiving light from an assigned light source;

generating a predetermined basic light distribution in a pupil plane of an illumination system, the predetermined basic light distribution being selected from the group consisting of:
  (i) conventional illumination with a predetermined degree of coherence, and
  (ii) off-axis illumination
  wherein the off-axis illumination is selected from the group consisting of:
    (i) annular field illumination, and
    (ii) multi-polar illumination;
driving individual elements of at least one array of individually drivable optical elements positioned in or in proximity to the pupil plane, or in a plane that is optically conjugate to the pupil plane, to filter a part of the basic light distribution; and
adapting the basic light distribution generated by the pupil shaping unit and a transmission function of the array of individually drivable optical elements to a mask structure to be illuminated.

22. An illumination system for a microlithography projection exposure apparatus configured to illuminate an illumination field with light from an assigned light source, comprising:
  a variable pupil shaping unit comprising a plurality of optical elements configured to receive light from the assigned light source and to generate a light bundle with a basic light distribution in a pupil plane of the illumination system;
  an array of individual adjustable optical elements, wherein the individual adjustable optical elements are arranged in a two-dimensional raster arrangement and configured to be adjusted to provide a location-dependent two-dimensional transmission function; and
  a control unit configured to adapt the transmission function of the array of individual adjustable optical elements to a mask structure to be illuminated,
  wherein the array of individual adjustable optical elements is arranged in or in proximity to the pupil plane of the illumination system, or in or in proximity to a plane of the illumination system that is optically conjugate to the pupil plane of the illumination system.

23. An illumination system for a microlithography projection exposure apparatus configured to illuminate an illumination field with light from an assigned light source, comprising:
  a variable pupil shaping unit comprising a plurality of optical elements configured to receive light from the assigned light source and to generate a light bundle with a basic light distribution in a pupil plane of the illumination system;
  an array of individual adjustable optical elements, wherein the individual adjustable optical elements are arranged in a two-dimensional raster arrangement and configured to be adjusted to provide a two-dimensional transmission function variable in a location-dependent fashion, and
  a control unit configured to adapt the basic light distribution generated by the pupil shaping unit and the transmission function of the array of individual adjustable optical elements to a mask structure to be illuminated,
  wherein the array of individual adjustable optical elements is arranged in or in proximity to the pupil plane of the illumination system, or in or in proximity to a plane of the illumination system that is optically conjugate to the pupil plane of the illumination system.

* * * * *

UNITED STATES PATENT AND TRADEMARK OFFICE
CERTIFICATE OF CORRECTION

PATENT NO. : 8,792,082 B2  
APPLICATION NO. : 12/984078  
DATED : July 29, 2014  
INVENTOR(S) : Markus Brotsack Page 1 of 1

It is certified that error appears in the above-identified patent and that said Letters Patent is hereby corrected as shown below:

In the Specification:
Column 5; Line 10; change "spacially" to -- spatially --.

Column 5; Line 15; change "spacially" to -- spatially --.

Column 7; Line 16; change "microlitho-graphy" to -- microlithography --.

In the Claims:
Column 11; Line 60; In Claim 7 change "to 4," to -- to claim 4, --.

Signed and Sealed this  
Twenty-fourth Day of November, 2015

Michelle K. Lee  
*Director of the United States Patent and Trademark Office*